(12) United States Patent
Shew

(10) Patent No.: US 8,168,373 B2
(45) Date of Patent: May 1, 2012

(54) METHOD FOR FABRICATING 3D MICROSTRUCTURE

(75) Inventor: Bor-Yuan Shew, Toufen Township, Miaoli County (TW)

(73) Assignee: National Synchrotron Radiation Research Center, Hsinchu (TW)

( * ) Notice: Subject to any disclaimer, the term of this patent is extended or adjusted under 35 U.S.C. 154(b) by 391 days.

(21) Appl. No.: 12/483,061

(22) Filed: Jun. 11, 2009

(65) Prior Publication Data

US 2010/0285412 A1   Nov. 11, 2010

(30) Foreign Application Priority Data

May 5, 2009   (TW) ................................ 98114840 A

(51) Int. Cl.
*G03F 7/26* (2006.01)
*G03F 7/20* (2006.01)
(52) U.S. Cl. ........................................ 430/311; 430/397
(58) Field of Classification Search .................. 430/311, 430/322, 397
See application file for complete search history.

(56) References Cited

U.S. PATENT DOCUMENTS

2006/0256306 A1* 11/2006 Lin et al. ........................ 355/53

OTHER PUBLICATIONS

Dammel et al., "193nm Immersion Lithography—Taking the Plunge," Journal of Photopolyme Science and Technology, pp. 587-601, vol. 17.
Hirai et al., "Moving mask UV lithography for three-dimensional structuring" J. Micromech, Microeng., 2007, pp. 199-206, vol. 17.
Chuang et al., "Reduction of diffraction effect of UV exposure on SU-8 negative thick photoresist by air gap elimination," Microsystem Technologies, 2002, pp. 308-313, vol. 8.
Sugiyama et al., "Plain-pattern to cross-section tranfers (PCT) technique for deep x-ray lithography and applications," J. Micromech. Microeng., 2004, pp. 1399-1404, vol. 14.

* cited by examiner

*Primary Examiner* — Kathleen Duda
*Assistant Examiner* — Caleen Sullivan
(74) *Attorney, Agent, or Firm* — Muncy, Geissler, Olds & Lowe, PLLC

(57) ABSTRACT

A method for fabricating 3D microstructure is disclosed. A matching fluid is arranged between the mask and the photoresist layer. When the mask and photoresist layer perform the relative scanning and exposure process simultaneously, the matching fluid will reduce the diffraction error, so that the gap between the mask and the photoresist layer becomes more tolerable. Besides, the matching fluid also acts as a lubricant for achieving a smooth scanning process, so as to fabricate a high-precision large-area 3D optical microstructure.

14 Claims, 5 Drawing Sheets

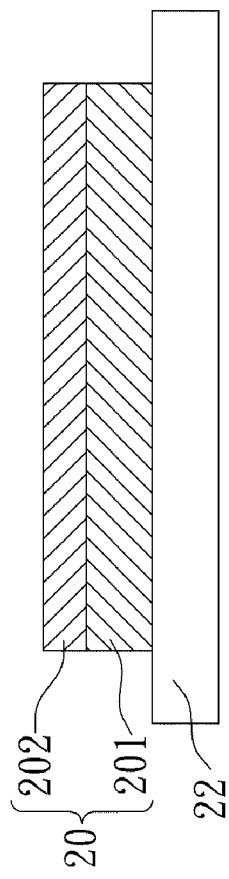
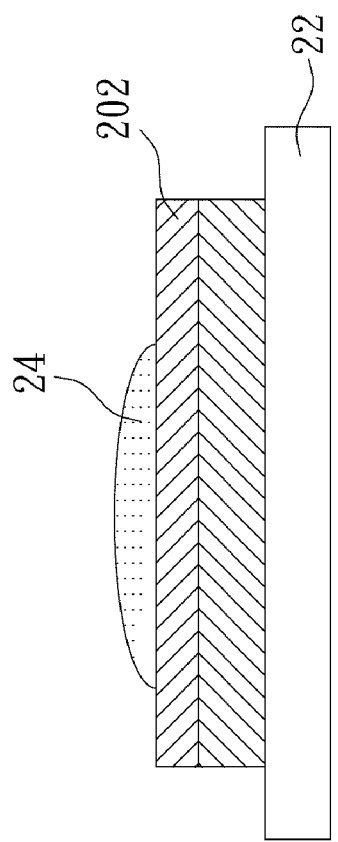
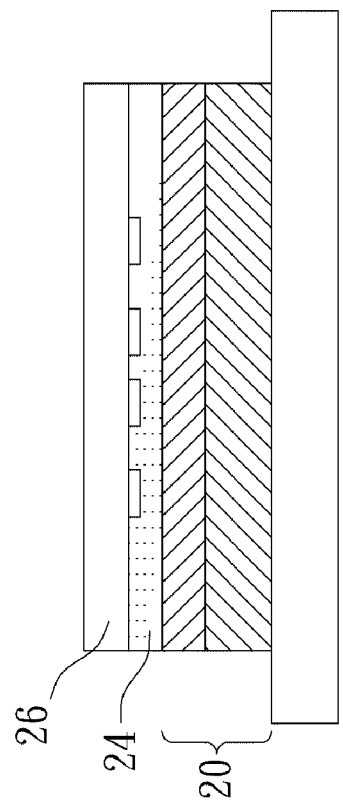

US 8,168,373 B2

METHOD FOR FABRICATING 3D MICROSTRUCTURE

BACKGROUND OF THE INVENTION

1. Field of the Invention

The present invention relates to a method of fabricating 3D microstructure, and more particularly, to a method of fabricating 3D microstructure by using a scanning immersion lithography process.

2. Background of the Related Art 3D microstructure plays an important role in the optoelectronic industry. Many fantastic optical functionalities, such as light splitting, focusing, dispersing, polarizing and uniforming, can be realized via engineering the geometry of the optics and their interacting microstructure. Hence, the 3D microstructure is very useful in optical application, such as the light-guide plate of display, the illumination, the optical microlens, the projector and the optical grating.

Traditionally, 3D microstructure is fabricated by high-precision machining. However, this technique can only applied for fabricating 3D microstructure with simple geometry and low precision; It is then not suitable to fabricate novel optics, such as a hybrid lens combining refractive/diffractive functions.

Therefore, using a lithography technique to fabricate the 3D microstructure is a present developing trend, and the lithography technique includes the following methods.

(1) Direct-writing lithography: a laser, e-beam or ion beam is used to provide grey-tone exposure and fabricate the 3D microstructure. This is a simple method, but it is very time-consuming and is not ideal for obtaining reproducible quality.

(2) A grey-tone mask is used to provide grey-tone exposure and then developed to fabricate the 3D microstructure. In this technique, the lithographic process is rather simple, however complex optical simulation, compensation and fabrication processes are required for fabricating the grey-tone mask, in which is very expensive.

(3) Scanning lithography: a relative motion between the mask and the photoresist is performed to provide grey-tone exposure and then developed to fabricate the 3D microstructure. During the scanning and exposure process, an appropriate gap between the mask and the photoresist is required to be maintained for the relative scanning motion. If the gap is too large, the diffraction error is increased to affect the fabrication precision. If the gap is too small, the friction between the mask and the photoresist would destroy the resist surface and hamper the scanning motion.

Synchrotron X-ray was traditionally used as a light source due to its small diffraction error, but the synchrotron source is limited and the vacuum chamber for exposure is not easy to be scaled-up and therefore is unfavorable for fabricating large-area optical device. Ultraviolet (UV) was ever used as the light source to perform the scanning exposure process, wherein the gap between the mask and the photoresist need to be reduced to decrease the diffraction error. However, when the gap is substantially reduced (<50 μm), the thickness uniformity of the photoresist layer and the machine precision are critical, which would markedly increase the cost of scanning stage and therefore unfavorable for fabricating large-area 3D microstructure.

FIG. 1 is a SEM view illustrating a portion of a 3D microstructure fabricated via scanning exposure process with the UV light source, wherein an air gap of 300 μm is sustained between the mask and the photoresist. It is observed that the cross-section of the microstructure 10 is rather irregular and the surface quality is poor, which is not adequate for fabricating high-precision 3D microstructures.

SUMMARY OF THE INVENTION

In order to resolve the foregoing problems, one object of this invention is to provide a method for fabricating 3D microstructure, wherein a matching fluid is arranged between the mask and the photoresist layer. When the mask and photoresist layer proceed the relative scanning and the exposure process simultaneously, the matching fluid will reduce the diffraction error, so that the gap between the mask and the photoresist layer becomes more tolerable. The matching fluid also acts as a lubricant for achieving a smooth scanning motion. All these features will substantially relax the requirements for the stage precision and the resist's thickness uniformity, reduce the expense for the process equipment, and facilitate large-area fabrication of 3D microstructure.

One object of this invention is to provide a method for fabricating 3D microstructure, wherein because of the use of the matching fluid, a simple UV light may be used as an exposure source without using any expensive light source, to have the advantage of the low cost.

One object of this invention is to provide a method for fabricating 3D microstructure. Compared to the direct-writing lithography which uses a laser, e-beam or ion beam and takes a long time to fabricate 3D microstructure, the present invention may fabricate a high-precision and a large-area 3D optical microstructure in a comparatively short time.

Accordingly, one embodiment, a method for fabricating 3D microstructure comprises providing a photoresist strip; applying a matching liquid on the photoresist strip; arranging a mask on the photoresist strip, wherein the matching liquid is disposed between the mask and the photoresist strip; controlling the photoresist strip and or the mask to perform a relative horizontal scanning process, and exposing the photoresist strip during the relative horizontal scanning process; and removing the matching liquid, and then developing the photoresist strip.

BRIEF DESCRIPTION OF THE DRAWINGS

FIG. 2a to FIG. 2e illustrates a flow of a method for fabricating a 3D microstructure in accordance with an example embodiment of the present invention;

DETAILED DESCRIPTION OF THE INVENTION

Figure 2D:
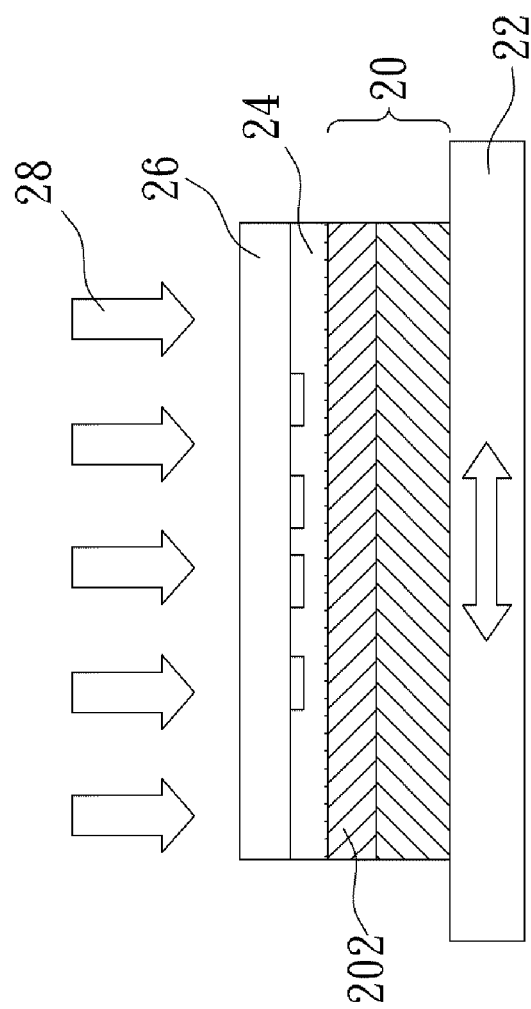

FIG. 2a to FIG. 2e illustrates a flow of a method for fabricating a 3D microstructure in accordance with an example embodiment of the present invention. First, as illustrated in FIG. 2a, a photoresist strip 20 is provided. In one example embodiment, the photoresist strip 20 is configured on a moving stage 22. The photoresist strip 20 includes a substrate 201 and a photoresist layer 202 which is uniformly arranged on the substrate 201 by spin coating and soft bake process, wherein the material of the photoresist layer 202 may be a positive photosensitive material or a negative photosensitive material, and the thickness of the photoresist layer 202 is determined according to the 3D microstructure requirement.

Next, as illustrated in FIG. 2b, a matching liquid 24 is applied on the photoresist layer 202. Next, as illustrated in FIG. 2c, the moving stage 22 rises to approach a fixed mask 26 and portion of the mask 26 on the photoresist strip 20, wherein the matching liquid 24 is compressed and spread as a continuous thin layer between the mask 26 and the photoresist strip 20.

Next, as illustrated in FIG. 2d, the moving stage 22 proceeds a relative horizontal scanning, and the photoresist strip 20 is exposed simultaneously during the relative horizontal scanning, wherein the horizontal scanning speed, route and frequency are adjusted to achieve a grey-tone exposure, so as to control the exposure dosage of the photoresist layer 202. In one example embodiment, the horizontal scanning speed of the moving stage 22 is 0.5 mm/s, and the moving stage 22 moves back and forth several times to expose the photoresist layer 202 with a predetermined exposure dosage level.

Continuously, the relative horizontal scanning refers to a relative motion between the photoresist strip 20 and the mask 26. In one embodiment, the photoresist strip 20 may be fixed while the mask 26 moves back and forth, alternatively the mask 26 may be fixed and the photoresist strip 20 moves back and forth, or combination thereof. Furthermore, the relative horizontal scanning process may move along a single axis, double axes or triple axes (x, y, θ), and maybe move along multi axes in turn or move along multi axes simultaneously. The relative horizontal scanning process may also move with a constant velocity or a variable velocity to perform various grey-tone exposures. On the other hand, in another example embodiment, the mask and the substrate of the photoresist strip may be both the curved surface structures, besides the plane surface structures, to fabricate another 3D microstructure with different outline.

The exposure step uses a UV light source 28, and the wavelength of the UV light source 28 is in accordance with the characteristic of the photoresist layer. In one example embodiment, the wavelength of the UV light source 28 is between 250 nm and 500 nm, and the UV light source 28 comprises a high pressure mercury lamp, lasers or LEDs. It is noted that when the UV light source 28 is turned on, it is preferable to wait until the UV light source 28 is stable and then proceed with the operation of the moving stage 22 with appropriate scanning speed and times to simultaneously conduct the relative horizontal scanning step and the exposure step such that during the waiting time, the photoresist strip is located on a shadow area (not shown) of the mask.

Figure 2E:
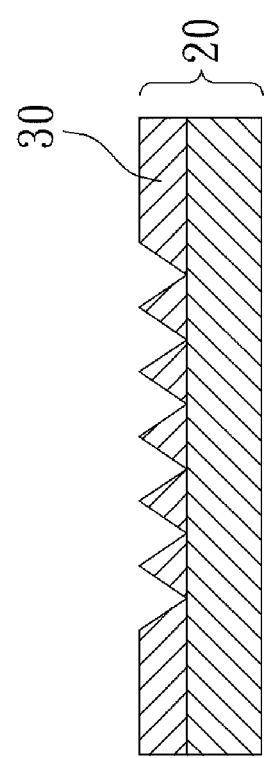

After finishing the exposure step, the UV light source 28 is turned off, the moving stage 22 is descended to release the mask 26, and the photoresist strip 20 is taken out. Thereafter, the matching liquid is removed and then the photoresist strip 20 is developed using appropriate chemicals to obtain a 3D microstructure 30, as illustrated in FIG. 2e. In one example embodiment, the photoresist strip 20 is rinsed with DI water to remove any residual matching liquid 24, and then the photoresist strip 20 is blown dry by a compressed air. Next, the photoresist strip 20 is placed in the developer with agitation for about five minutes to obtain the 3D microstructure 30.

In the foregoing example embodiments, the mask maybe made of glass, quartz or soft polymer, and the mask has a light-pervious pattern. The refraction coefficient of the matching liquid is between or close to a refraction coefficient of the mask and a refraction coefficient of the photoresist layer. The refraction coefficient of the matching liquid may be between 1.01 and 1.99, and preferably between 1.3 and 1.6. On the other hand, the matching liquid with an appropriate viscosity and surface tension is selected, so that the matching liquid between the mask and the photoresist layer can maintained at a stable and continuous condition during the scanning and exposure process. The matching liquid also needs to have a good optical stability, to prevent the matching liquid from reacting with the photoresist layer, so that the quality of the 3D microstructure will not be adversely affected. Furthermore, the matching liquid needs to be easily removed to benefit the following developing step.

In one example embodiment, glycerol may be used as the matching liquid. The refraction coefficient of the glycerol is about 1.47 when the wavelength of the UV light source is 420 nm. This refraction coefficient of the glycerol (1.46) approaches the refraction coefficient of the glass mask (1.54) and the refraction coefficient of the photoresist layer (1.5). It is noted that when applying the glycerol on the photoresist strip, the glycerol may be subjected to a vacuum degassing process in advance to prevent any residual air bubble from adversely affecting the exposure step.

Figure 1:
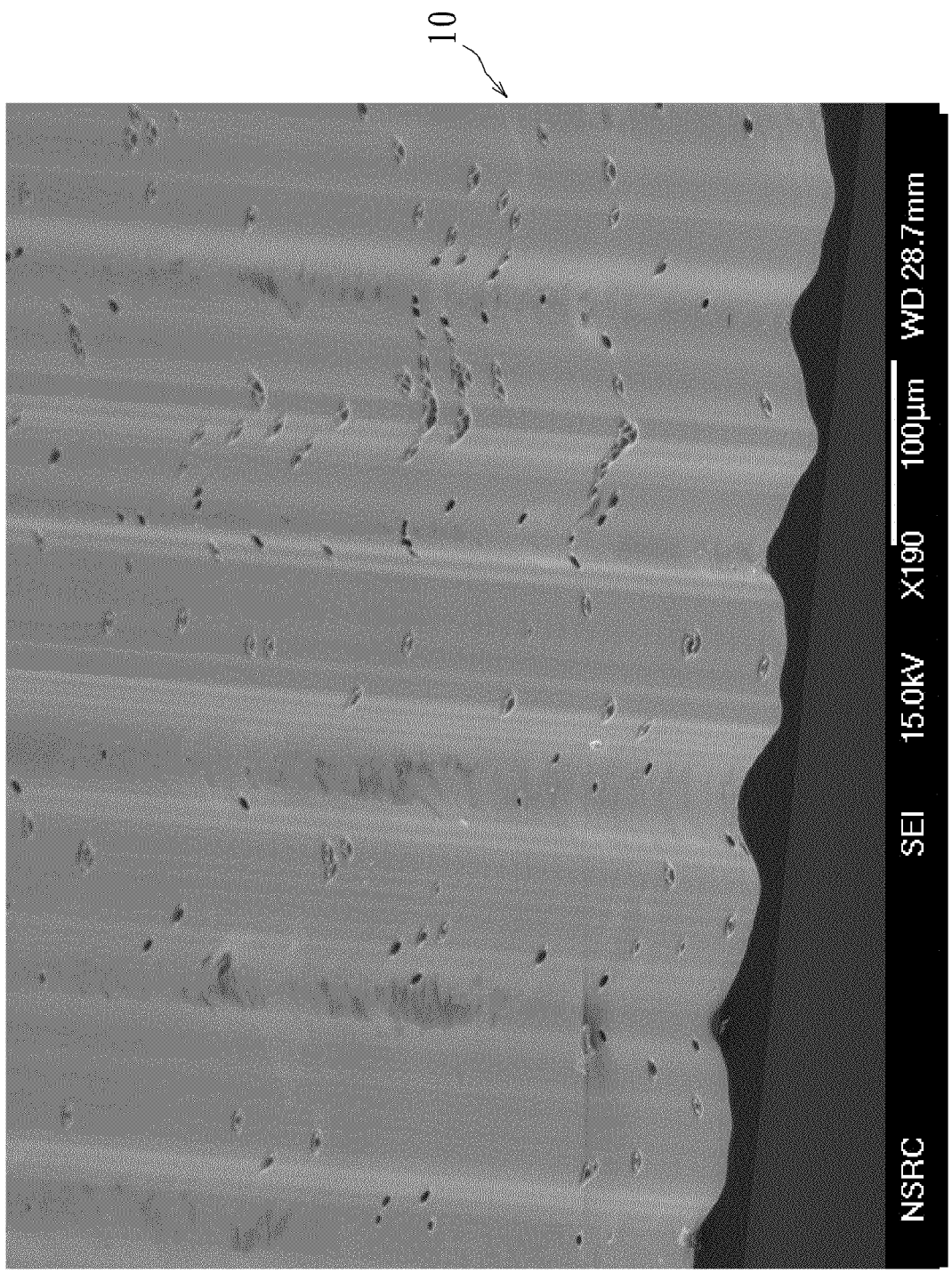
FIG. 1 is a typical SEM view illustrating a portion of a 3D microstructure fabricated by using a UV light source and performing a scanning and exposure process, wherein a air gap is sustained between the mask and the photoresist.
Figure 3:
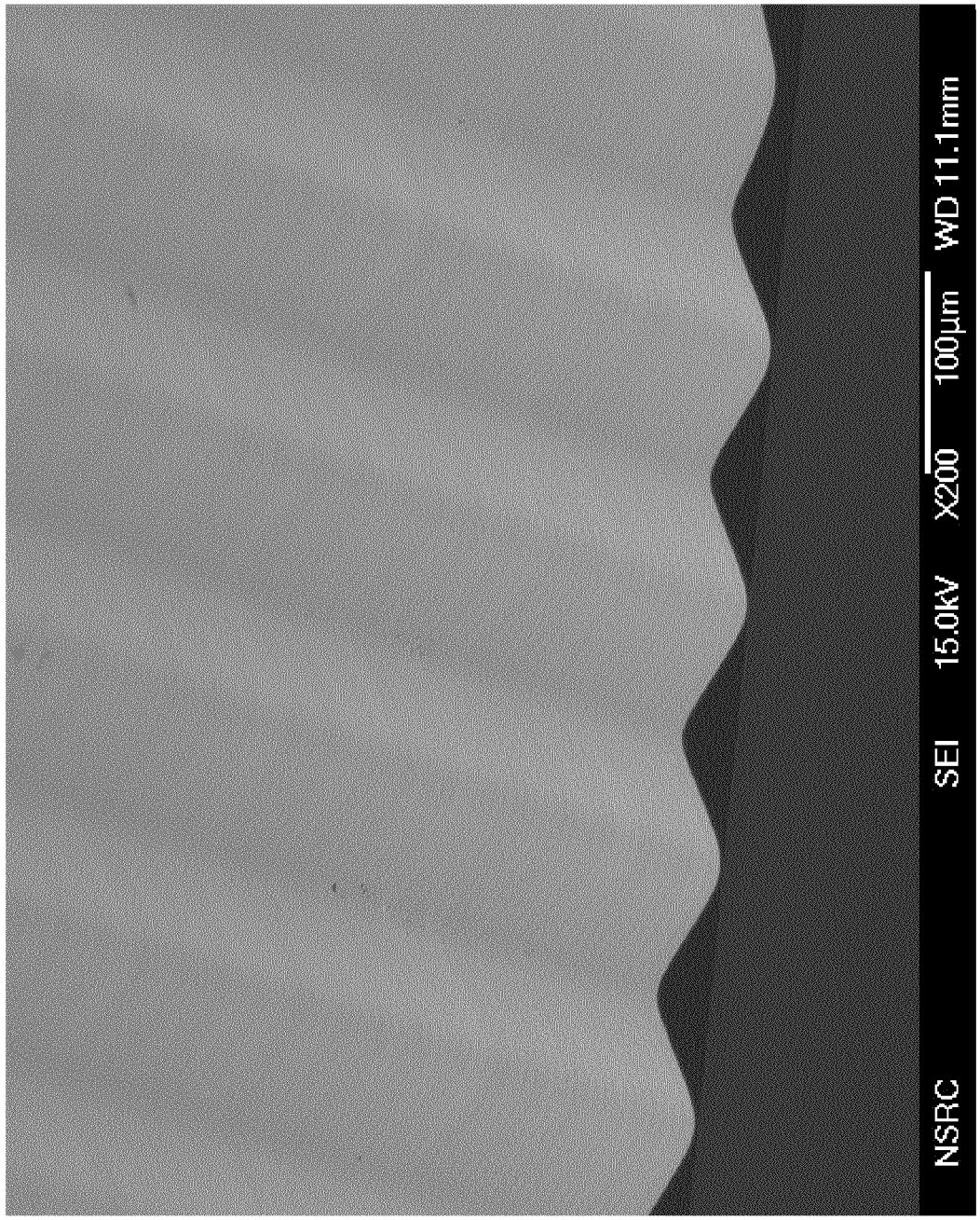
FIG. 3 is a SEM view illustrating a portion of a 3D microstructure fabricated by using the UV light source and performing a scanning and exposure process in accordance with an example embodiment of the present invention, wherein glycerol is applied between the mask and the photoresist. Besides, the other scanning lithography parameters are the same with those for fabricating the microstructure as presented in FIG. 1.

FIG. 3 is a SEM view illustrating a portion of a 3D microstructure, wherein the glycerol is used as the matching liquid when performing the scanning and exposure process. Compared to a SEM view illustrating in the FIG. 1 under the same experimental parameters, including the same UV light source, the same photosensitive material, the same gap size between the mask and the photoresist layer, and at the same scanning speed and speed times, it is shown that the 3D microstructure fabricated by the present invention will have the uniform shape and better topography. Hence, this better 3D microstructure can be used in the subsequent process to fabricate a large number of high-precision 3D microstructures by a LIGA technique, which includes a micro electroforming and a micro-molding process.

Figure 4:
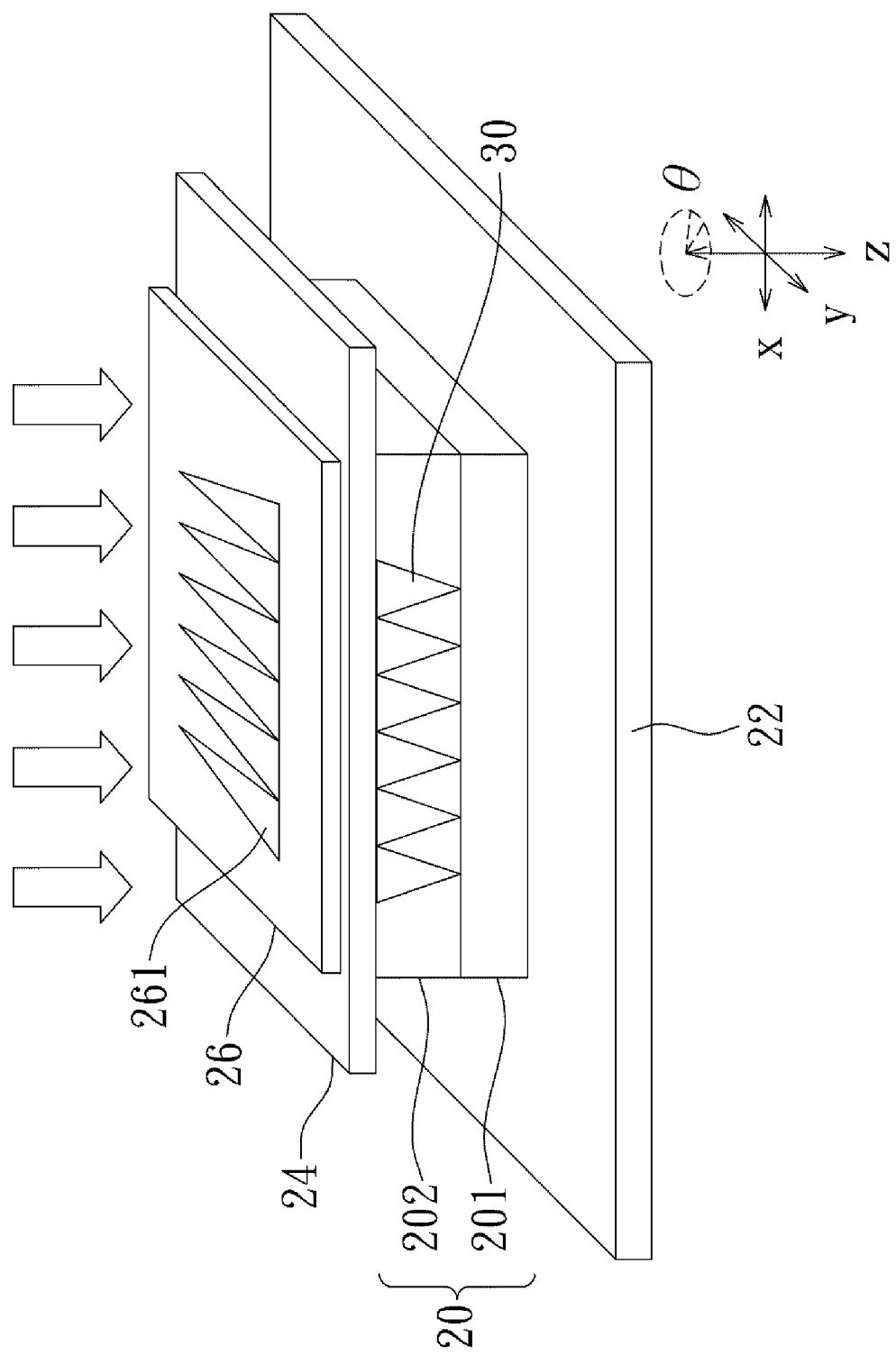
FIG. 4 is a diagram illustrating an arrangement of the mask and the photoresist layer during the scanning and exposure process in accordance with an example embodiment of the present invention.

FIG. 4 is a diagram illustrating an arrangement of the mask and the photoresist layer during the scanning and exposure process in accordance with an example embodiment of the present invention. As illustrated in FIG. 4, the mask 26 has a triangular light-pervious pattern 261. The photoresist strip 20, including the substrate 201 and the photoresist layer 202, along with the moving stage 22 rises along the z-axis direction to decide the thickness of the matching liquid 24 between the photoresist layer 202 and the mask 26. When performing the exposing step, the photoresist strip 20 along with the moving stage 22 moves along the y-axis direction back and forth, so as to obtain a 3D microstructure 30 shown in the photoresist layer 202 of the FIG. 3.

In the present invention, the matching fluid acts as a lubricant for achieving a smooth scanning, and the matching fluid between the mask and the photoresist layer will reduce the diffraction error during the scanning and exposure process, so that the gap between the mask and the photoresist layer becomes more tolerable. Therefore, the uniformity of the photoresist layer thickness and the precision of the moving stage are less critical, and therefore substantially reduce the expense of the moving stage and thus reduce the cost of fabricating large-area 3D optical microstructure. Compared to the direct-writing lithography which uses a laser, e-beam or ion beam, and takes long time to fabricate 3D microstructure, the present invention may fabricate a high-precision and large-area 3D optical microstructure in a comparatively short time. In stead of expensive short-wavelength light source (such as X-ray), a simple UV light source may be used in the proposed technique, which will benefit a low-cost 3D microfabrication.

Although the present invention has been explained in relation to its preferred embodiment, it is to be understood that other modifications and variation can be made without departing the spirit and scope of the invention as hereafter claimed.

What is claimed is:

1. A method for fabricating 3D microstructure, comprising:
   providing a photoresist strip;
   applying a matching liquid on said photoresist strip;
   arranging a mask comprising at least one pattern on said photoresist strip, wherein said matching liquid is disposed between said mask and said photoresist strip;
   controlling said photoresist strip and or said mask to perform a relative horizontal scanning process, and exposing said photoresist strip along a scanning direction during said relative horizontal scanning process, wherein said pattern has a different spread along said scanning direction, so that said photoresist strip has an exposed area distributing over different accumulative exposure dosage along a direction perpendicular to said scanning direction; and
   removing said matching liquid, and then developing said photoresist strip.

2. The method for fabricating 3D microstructure according to claim 1, wherein said scanning direction of said relative horizontal scanning process moves along a single axis, double axes or multi axes.

3. The method for fabricating 3D microstructure according to claim 1, further comprising a moving stage for placing said photoresist strip, wherein said moving stage performs a raising motion to adjust a thickness of said matching liquid between said mask and said photoresist strip.

4. The method for fabricating 3D microstructure according to claim 1, wherein a refraction coefficient of said matching liquid is between 1.01 and 1.99.

5. The method for fabricating 3D microstructure according to claim 1, wherein said exposing step uses a UV light source.

6. The method for fabricating 3D microstructure according to claim 5, wherein a wavelength of said UV light source is between 250 nm and 500 nm.

7. The method for fabricating 3D microstructure according to claim 1, wherein said mask comprises a light-pervious pattern and said mask material comprises a glass, a quartz or a soft polymer.

8. The method for fabricating 3D microstructure according to claim 1, wherein said photoresist strip comprises a substrate and a photoresist layer is coated on said substrate.

9. The method for fabricating 3D microstructure according to claim 8, wherein said photoresist layer comprises a positive photosensitive material or a negative photosensitive material.

10. The method for fabricating 3D microstructure according to claim 8, wherein a refraction coefficient of said matching liquid is between a refraction coefficient of said mask and a refraction coefficient of said photoresist layer.

11. The method for fabricating 3D microstructure according to claim 8, wherein said mask and said substrate comprise a plane surface structure or a curved surface structure.

12. The method for fabricating 3D microstructure according to claim 1, wherein said relative horizontal scanning moves with a constant or a variable velocity.

13. A method for fabricating 3D microstructure, comprising:
   providing a photoresist strip on a moving stage;
   applying a matching liquid on said photoresist strip;
   arranging a mask on said photoresist strip, wherein said matching liquid is disposed between said mask and said photoresist strip;
   controlling said photoresist strip and or said mask to perform a relative horizontal scanning process, and exposing said photoresist strip during said relative horizontal scanning process, wherein said moving stage performs a raising motion to adjust a thickness of said matching liquid between said mask and said photoresist strip; and
   removing said matching liquid, and then developing said photoresist strip.

14. A method for fabricating 3D microstructure, comprising:
   providing a photoresist strip comprising a substrate and a photoresist layer coated on said substrate;
   applying a matching liquid on said photoresist strip, wherein a refraction coefficient of said matching liquid is between a refraction coefficient of said mask and a refraction coefficient of said photoresist layer;
   arranging a mask on said photoresist strip, wherein said matching liquid is disposed between said mask and said photoresist strip;
   controlling said photoresist strip and or said mask to perform a relative horizontal scanning process, and exposing said photoresist strip during said relative horizontal scanning process; and
   removing said matching liquid, and then developing said photoresist strip.

* * * * *